(12) United States Patent
Uchida

(10) Patent No.: US 7,102,420 B2
(45) Date of Patent: *Sep. 5, 2006

(54) SEMICONDUCTOR DEVICE AND MANUFACTURING METHOD THEREOF

(75) Inventor: Hiroaki Uchida, Yamanashi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/316,360

(22) Filed: Dec. 11, 2002

(65) Prior Publication Data

US 2003/0124811 A1 Jul. 3, 2003

Related U.S. Application Data

(62) Division of application No. 09/735,543, filed on Dec. 14, 2000, now Pat. No. 6,528,416.

(30) Foreign Application Priority Data

May 31, 2000 (JP) .................................... 2000-161574

(51) Int. Cl.
*H01J 19/82* (2006.01)

(52) U.S. Cl. .................... 327/532; 324/158.1; 257/532

(58) Field of Classification Search .............. 257/523, 257/524, 532, 504, 508; 324/158.1, 754, 324/755, 756, 757, 758, 761, 765, 690
See application file for complete search history.

(56) References Cited

U.S. PATENT DOCUMENTS

| | | | |
|---|---|---|---|
| 5,321,211 A | 6/1994 | Haslam et al. | 174/262 |
| 5,394,012 A | 2/1995 | Kimura | 257/739 |
| 5,656,531 A | 8/1997 | Thakur et al. | 438/398 |
| 5,721,155 A | 2/1998 | Lee | 437/195 |
| 6,010,931 A | 1/2000 | Sun et al. | 438/240 |
| 6,261,900 B1 | 7/2001 | Liao et al. | 438/253 |
| 6,329,285 B1 | 12/2001 | Nagaoka | 438/637 |

*Primary Examiner*—Nestor Ramirez
*Assistant Examiner*—Trung Q Nguyen
(74) *Attorney, Agent, or Firm*—Volentine Francos & Whitt, PLLC

(57) ABSTRACT

Some of the members constituting a semiconductor element are formed from α-Si and an HSG forming process is implemented to form hemispherical polysilicon grains at some of the members formed from α-Si. Thus, a semiconductor device that is achieved without requiring a great number of manufacturing steps such as film formation and etching, facilitates control of the individual steps and assures reliable electrical connection between the members and a method of manufacturing such a semiconductor device are provided.

5 Claims, 22 Drawing Sheets

SEMICONDUCTOR DEVICE AND MANUFACTURING METHOD THEREOF

CROSS-REFERENCE TO RELATED APPLICATIONS

The present application is a divisional of Ser. No. 09/735,543 filed Dec. 14, 2000, now U.S. Pat. No. 6,528,416 under 35 U.S.C. § 121, end dated Mar. 4, 2003.

BACKGROUND OF THE INVENTION

1. Field of the Invention

The present invention relates to a semiconductor device achieved by adopting an HSG (hemispherical grained silicon) forming technology and a method of manufacturing the semiconductor device.

2. Description of the Related Art

When manufacturing a semiconductor device assuming a multilayer structure such as a DRAM in the prior art, extremely small plugs are formed at inter-layer films in order to electrically connect the layers.

FIGS. 3–5 are cross sectional views illustrating steps taken to form minute plugs at an inter-layer film in the semiconductor device assuming a multilayer structure through a manufacturing method in the prior art.

First, as illustrated in FIG. 3(a), element isolation regions 102, an electrode wiring 103 which may be utilized as, for instance, a bit line and an inter-layer film 104 are formed on a silicon substrate 101 through a method of the known art.

Next, a polysilicon film 105 to constitute a mask is formed over the inter-layer film 104, as shown in FIG. 3(b). It is to be noted that this film may be constituted of amorphous silicon (α-Si).

Then, after forming a film constituted of a resist 106 such as a photoresist on the mask polysilicon film 105, the resist 106 is patterned through lithography to remove the resist 106 over the areas where plugs are to be formed, as illustrated in FIG. 3(c).

When the mask polysilicon film 105 and the interlayer film 104 are etched by using the patterned resist 106 as a mask, as shown in FIG. 3(d) in the following step, areas 107 are formed.

After the remaining resist 106 is removed, a new polysilicon (or α-Si) film is formed. Then, by removing the polysilicon (or α-Si) film through slightly anisotropic etching, polysilicon (or α-Si) sidewalls to be utilized for PSC (poly-sidewall contact), i.e., sidewall polysilicon film 108, formed as illustrated in FIG. 4(a).

As shown in FIG. 4(b), minute contact holes 109 are formed by etching the inter-layer film 104 with the sidewall polysilicon films 108 used as a mask.

Next, a new polysilicon film, i.e., an embedding polysilicon film 110 is formed and part of the embedding polysilicon film 110 enters the contact holes 109 to form plugs in the following step, as illustrated in FIG. 4(c).

Then, as shown in FIG. 4(d), the embedding polysilicon film 110 and the mask polysilicon film 105 are removed through an etch-back or a CMP method (chemical mechanical polishing).

As a result, plugs each having an extremely small lower portion that is joined with the silicon substrate 101, the electrode wiring 103 or the like and a wide upper portion, i.e., a wide receptacle area over which the plug is joined with another layer, are obtained. Thus, as illustrated in FIG. 5, a second layer wiring 112 and a cell contact 113 to be connected with a DRAM capacitor, which are formed in a second inter-layer film 111 above the inter-layer film 104, can be joined with the wide receptacle areas of the plugs even if their positions do not exactly match the positions of the corresponding plugs.

However, in the semiconductor device manufacturing method in the prior art described above in which PSC (poly-sidewall contact) is utilized, the number of film forming steps is bound to be large.

In addition, when etching the mask polysilicon film 105 and the inter-layer film 104 by using the patterned resist 106 as a mask, as illustrated in FIG. 3(d), it is difficult to control the degree to which the inter-layer film 104 is etched.

Furthermore, with a great number of film forming/etching steps implemented, there is a greater risk of an abnormal pattern 114 being formed due to entry of minute impurities, i.e., particles 115. Moreover, since it is more difficult to achieve full control of the degree to which the inter-layer film 104, the second inter-layer film 111 and the like are etched, the receptacle area of a plug may become narrower or the lower end of the cell contact 113 may not reach a specific depth to result in an incomplete junction 115.

SUMMARY OF THE INVENTION

An object of the present invention is to provide a semiconductor device that can be achieved through a smaller number of film forming/etching steps and the like, facilitates control of the individual steps and assures reliable electrical connections between members, by solving the problems discussed above, and to provide a method of manufacturing such a semiconductor device.

In order to achieve the object above, the present invention provides:

(1) a semiconductor device having a semiconductor element with some of the members constituting a semiconductor element formed from α-Si having undergone a process implemented by adopting an HSG forming technology, and hemispherical grained polysilicon formed at some of the α-Si members;

(2) a semiconductor device manufacturing method in which some of the members constituting a semiconductor element or a portion of a mask is formed from α-Si, and a process is implemented by adopting an HSG forming technology to form polysilicon at the α-Si members or a portion of the mask.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

Figure 1A:
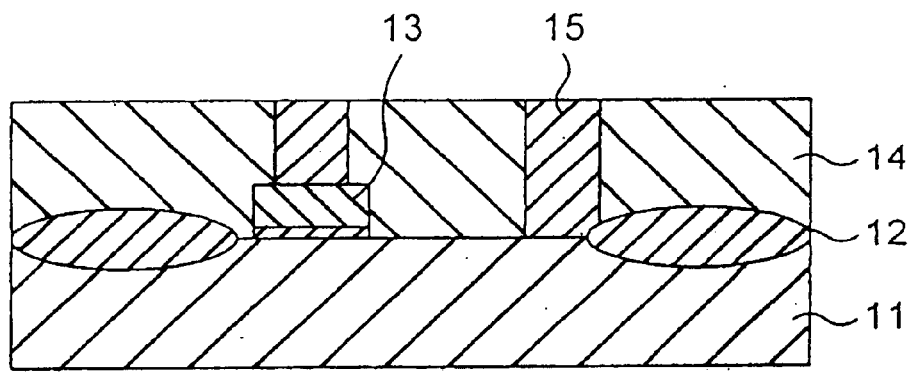
FIG. 1 presents sectional views of steps taken to form minute plugs at an inter-layer film of a semiconductor element assuming a multilayer structure through the manufacturing method in a first embodiment of the present invention.

The following is a detailed explanation of the embodiments of the present invention, given in reference to the drawings.

FIG. 1 presents sectional views of the steps taken to form minute plugs at an inter-layer film in a semiconductor element assuming a multilayer structure through the manufacturing method in the first embodiment of the present invention and FIG. 2 presents an example of an HSG forming technology that may be adopted in the first embodiment.

In order to manufacture a semiconductor device achieving a multilayer structure such as a DRAM, first, a transistor, element isolation regions 12, an electrode wiring 13 to be utilized as, for instance, a bit line, an inter-layer film 14 and the like are formed through a method of the known art on a silicon substrate 11. Then, after forming holes with an extremely small diameter at the inter-layer film 14 through lithography technology which utilizes light with a small wavelength such as excimer laser light, amorphous silicon (α-Si) is deposited on the inter-layer film 14. Through this process, the holes with the extremely small diameter, too, become filled with α-Si and, thus, contact plugs 15 are formed.

The lower ends of the contact plugs 15 are joined with the silicon substrate 11, the electrode wiring 13 or the like. It is to be noted that α-Si deposited to form the contact plugs 15 has a low phosphorus content, ideally in a concentration equal to or lower than $1 \times 10^{20}/cm^3$.

Subsequently, by removing the α-Si on the inter-layer film 14 through an etch-back or a CMP method (chemical/mechanical polishing method), contact plugs 15 constituted of α-Si with a very small diameter are formed inside the inter-layer film 14, as illustrated in FIG. 1(a).

Figure 1B:
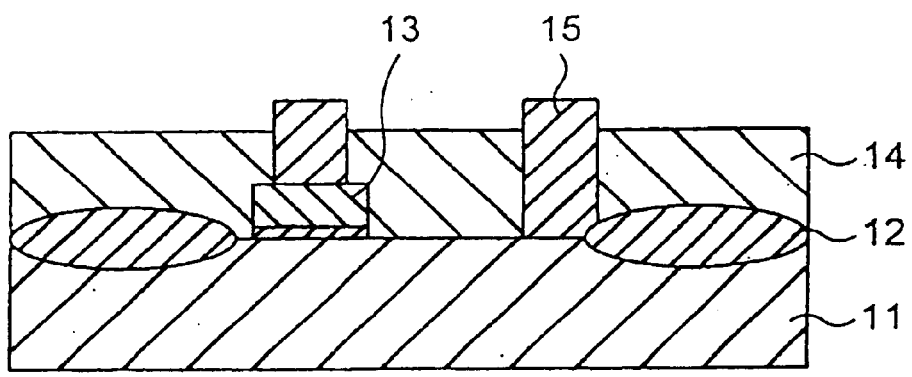

Next, as shown in FIG. 1(b), the inter-layer film 14 alone is selectively etched through, for instance, wet etching so as to allow the tops of the contact plugs 15 to project out of the inter-layer film 14.

Figure 1C:
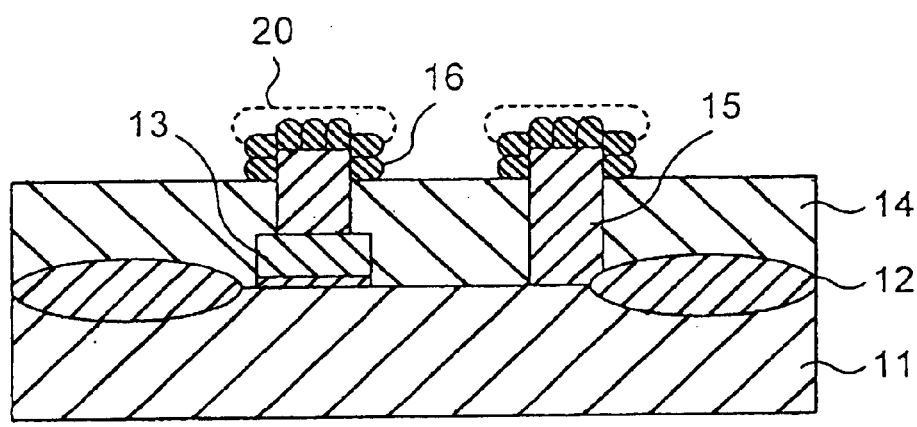

A polysilicon cap 16 is formed over a thickness of approximately 0.035 μm over the entire surface of the tops of the contact plugs 15 and wide receptacle areas 20 are formed at the tops, as shown in FIG. 1(c) by implementing an HSG forming process in the following step. It is to be noted that the thickness of the polysilicon cap 16 formed in this step can be varied as necessary by controlling the forming conditions.

Thus, the contact plugs 15 each having an extremely small lower portion that is joined with the silicon substrate 11, the electrode wiring 13 or the like and also having a wide upper portion, i.e., the receptacle area 20, that is joined with a wiring or the like in another layer, are obtained.

Through the HSG forming technology, which is employed to increase the surface area of capacitor electrodes in, for instance, a DRAM in this method, roughly hemispherical polysilicon grains are formed at the α-Si surfaces with a low phosphorous concentration, and an example of application of this technology is explained below.

Figure 2A:
FIG. 2 presents an example of the application of the HSG forming technology in the manufacturing method in the first embodiment of the present invention.
Figure 2B:
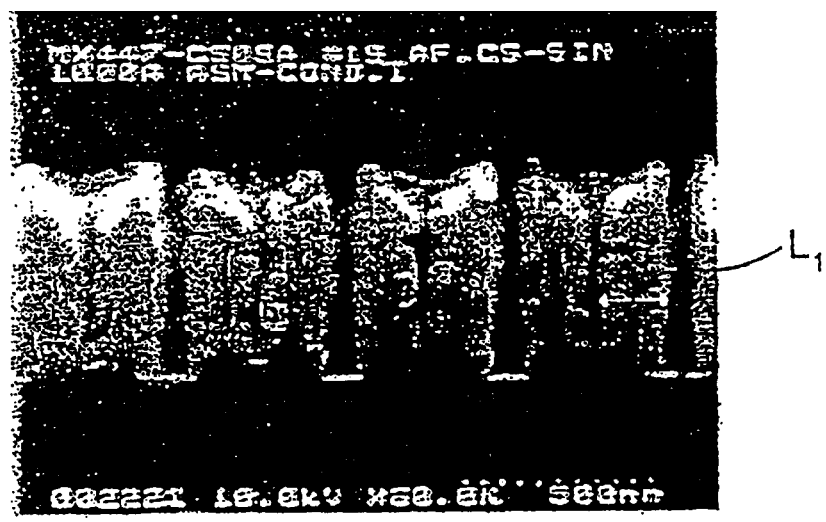
Figure 3A:
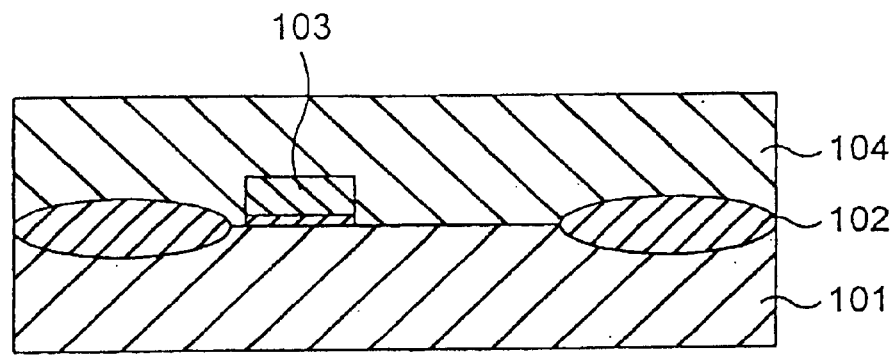
FIG. 3 presents sectional views (part 1) of steps taken to form minute plugs at an inter-layer film of a semiconductor device assuming a multilayer structure through a manufacturing method in the prior art.
Figure 3B:
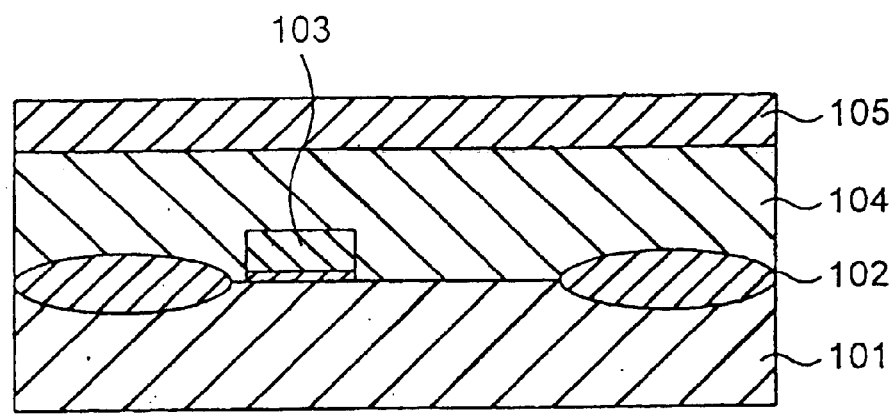
Figure 3C:
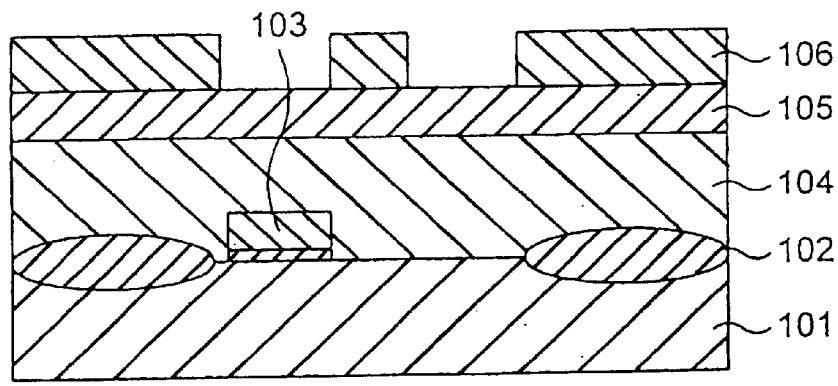
Figure 3D:
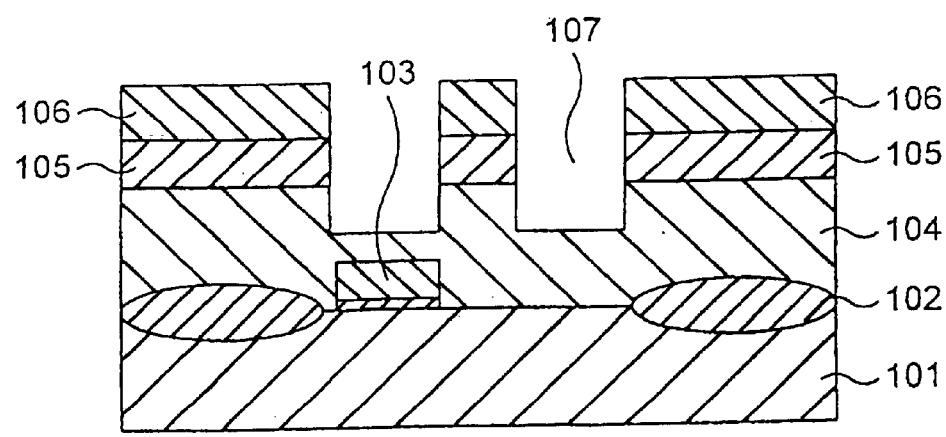
Figure 4A:
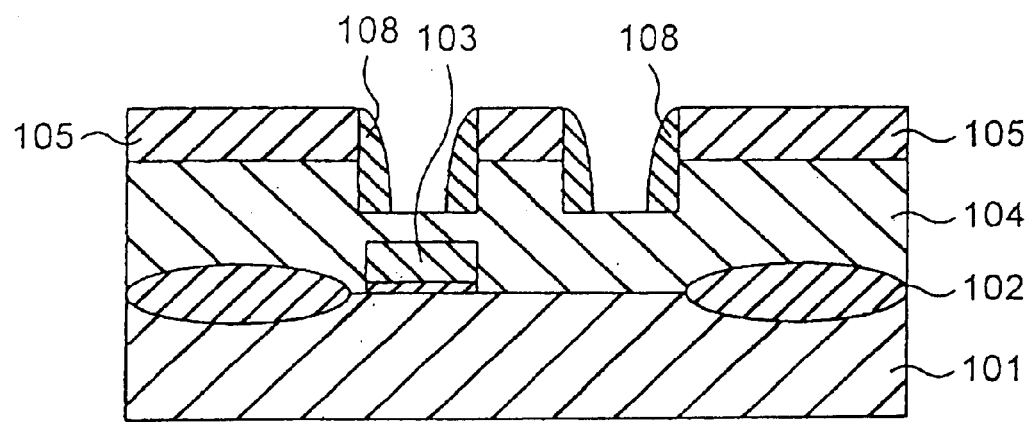
FIG. 4 presents sectional views (part 2) of steps taken to form, minute plugs at an inter-layer film of the semiconductor device assuming a multilayer structure through the manufacturing method in the prior art.
Figure 4B:
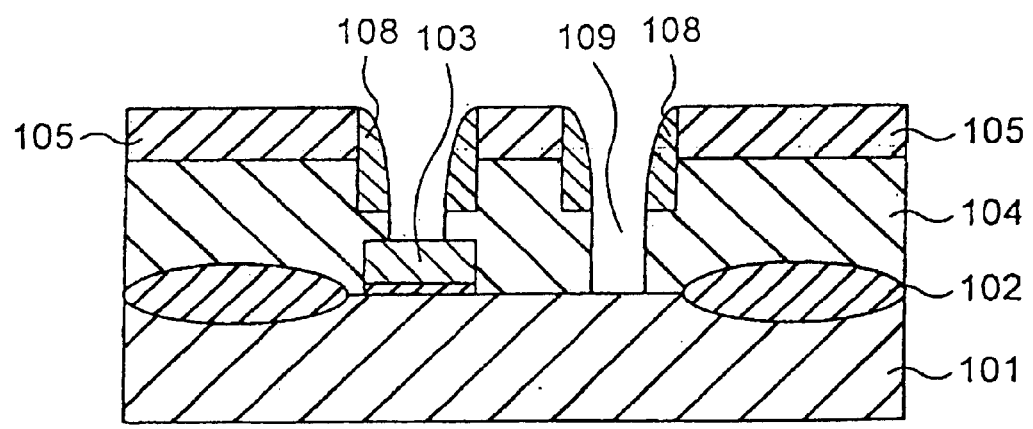
Figure 4C:
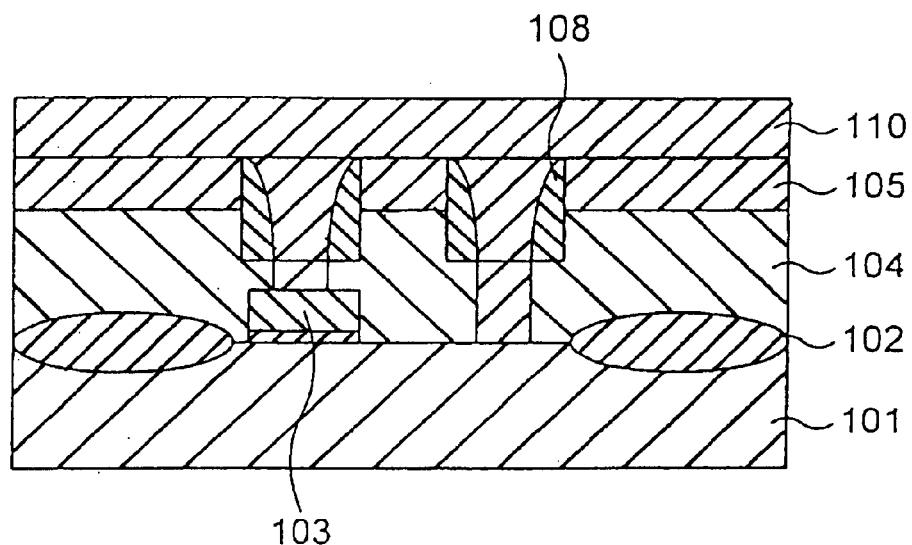
Figure 4D:
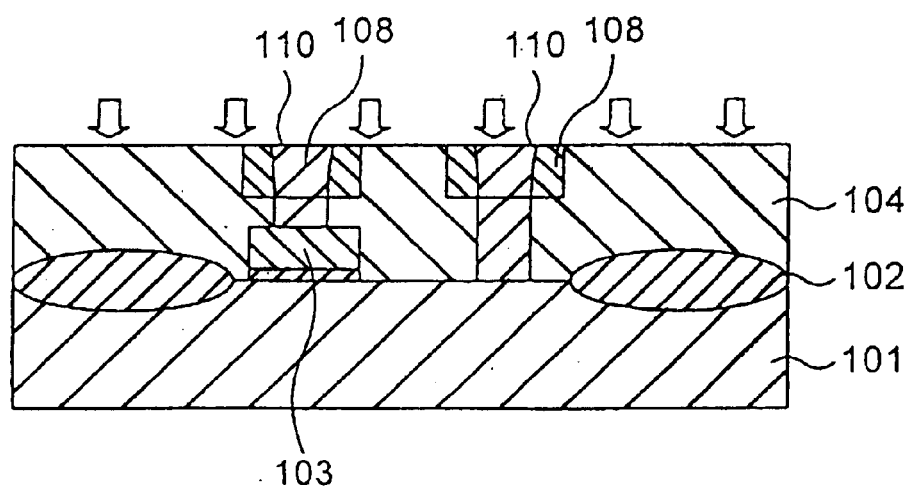
Figure 5:
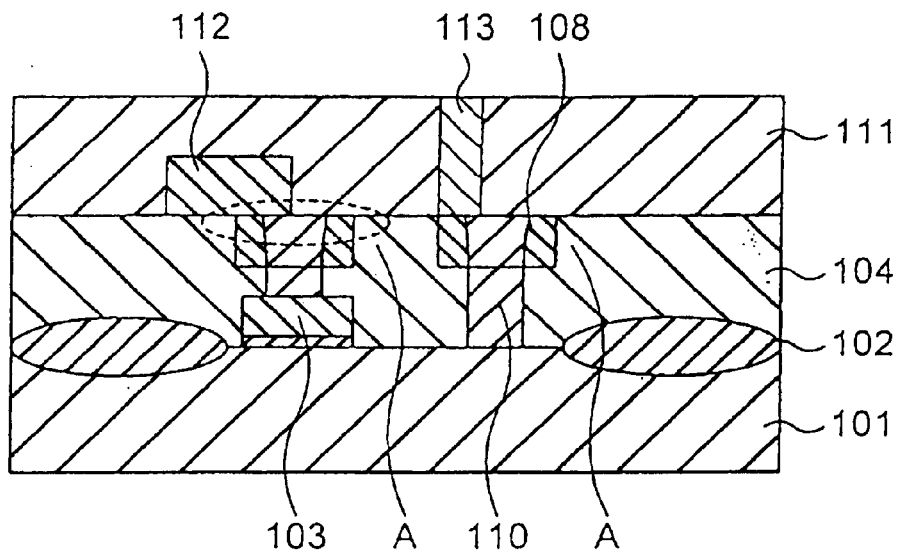
FIG. 5 presents sectional views (part 3) of steps taken to form minute plugs at the inter-layer film of the semiconductor device assuming a multilayer structure through the manufacturing method in the prior art.
Figure 6:
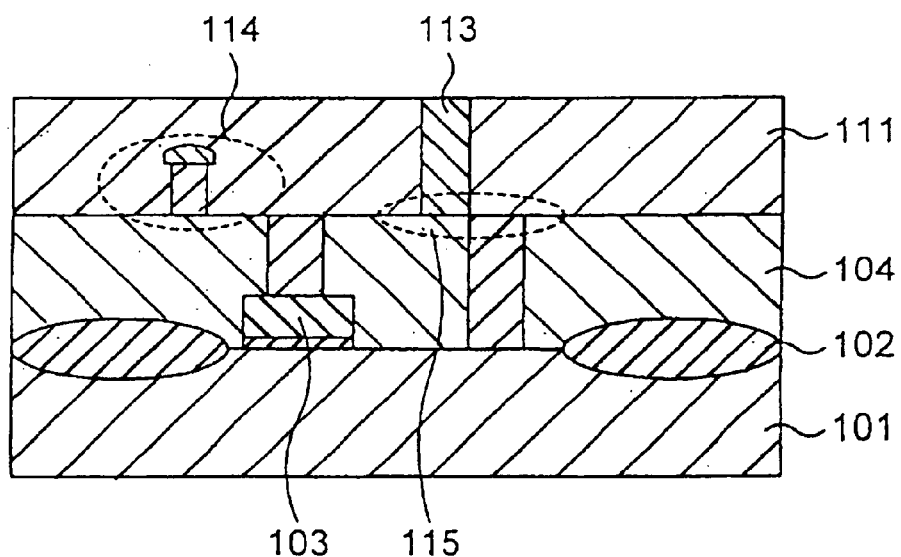
FIG. 6 illustrates problems (part 1) of the prior art technology.
Figure 7:
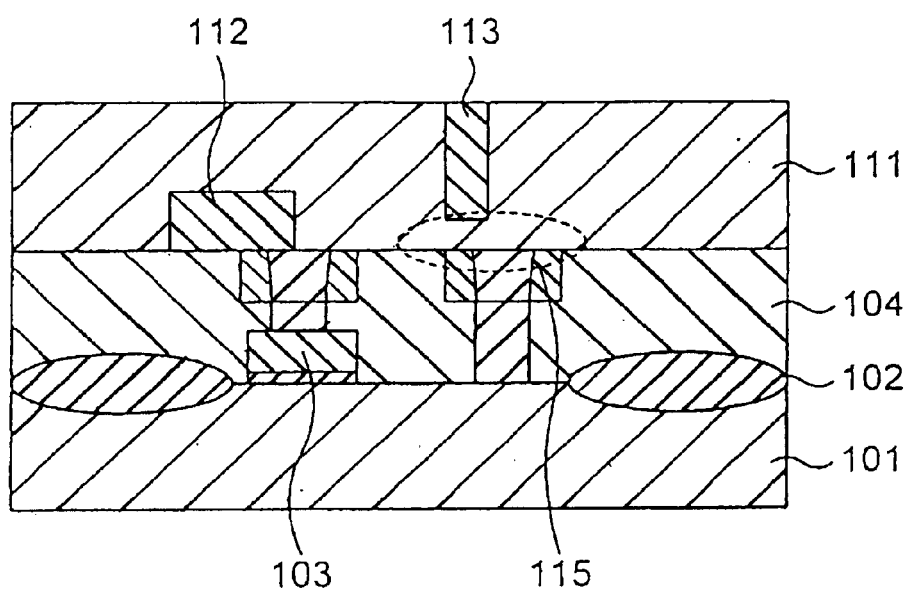
FIG. 7 illustrates problems (part 2) of the prior art technology.

First, as shown in FIG. 2(a), a thin film 21 (with a thickness L1 of approximately 0.10 μm) constituted of α-Si with a low phosphorous concentration is placed inside a vacuum chamber after removing the natural oxide film from its surface. Next, after inducing an Si gas such as SiH4 or Si2H6 into the vacuum chamber with the atmosphere therein achieving a high vacuum state with its temperature at approximately 500–650° C. and its pressure at approximately $1 \times 10^{-8}$ Torr, the thin film 21 is annealed at a temperature equal to or exceeding 600° C., to form roughly hemispherical polysilicon grains at the surface of the thin film 21, as shown in FIG. 2(b) with the thickness L2 of the thin film increasing to approximately 0.17 μm.

Figure 1D:
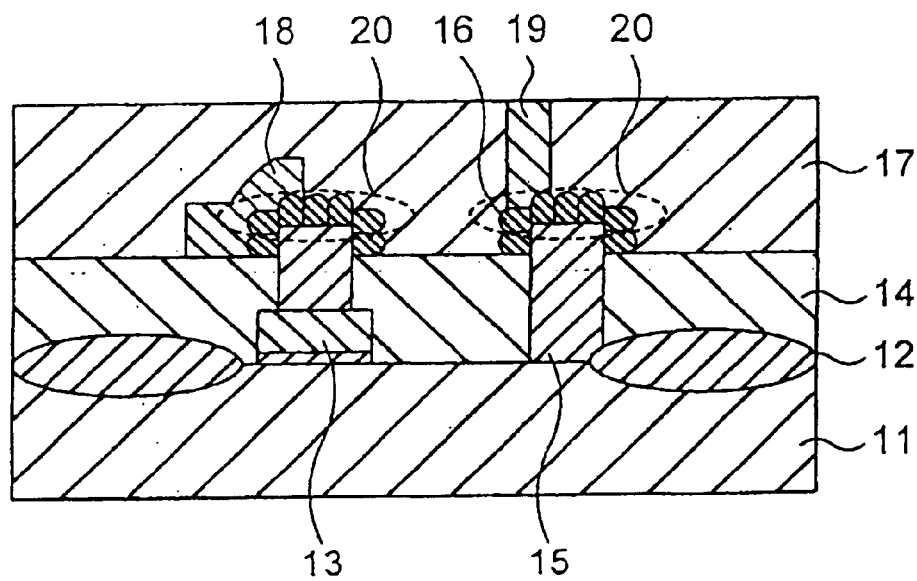

Then, as illustrated in FIG. 1(d), a second inter-layer film 17 that contains a second wiring layer 18 and a cell contact 19 to be connected to a DRAM capacitor or the like is formed on the inter-layer film 14. During this process, the second wiring layer 18 and the cell contact 19 may be formed through an lithography technology. Since the receptacle areas 20 are wide, the second wiring layer 18 and the cell contact 19 can be joined with the contact plugs 15 even if the positions of the second wiring layer 18 and the cell contact 19 are not exactly aligned with the positions of the corresponding contact plugs 15, i.e., even if the alignment is rough.

In addition, since the presence of the polysilicon cap 16 formed at the top faces of the contact plugs 15 increases the height of the receptacle areas 20, the lower end of the cell contact 19 can be joined with the receptacle area 20 even if the second inter-layer film 17 is not etched to a full degree when forming the cell contact 19.

As explained above, since wide receptacle areas 20 are formed at the tops of the contact plugs 15 through an HSG forming process in the embodiment, it is not necessary to implement a great number of film forming/etching steps, to reduce the risk of particle entry and the risk of wiring pattern defects.

Furthermore, since wide receptacle areas 20 with a large height are formed at the tops of the contact plugs 15, reliable contacts are achieved with ease even when the second wiring layer 18 and the cell contact 19 are not exactly aligned with the corresponding contact plugs 15 or the control on the etching quantity is not perfect.

Next, the second embodiment of the present invention is explained.

FIG. 8 presents sectional views of the steps taken to form minute plugs at an inter-layer film of a semiconductor element assuming a multilayer structure through the manufacturing method in the second embodiment of the present invention and FIG. 9 illustrates how varying phosphorous concentrations affects an HSG forming process. It is to be noted that the same reference numbers are assigned to components having identical structures identical to those in the first embodiment to preclude repeated explanation thereof.

Figure 8A:
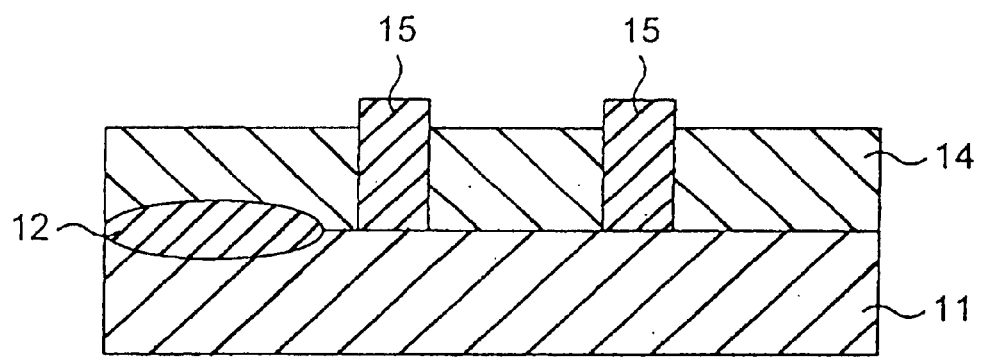
FIG. 8 presents sectional views of steps taken to form minute plugs at an inter-layer film of a semiconductor element assuming a multilayer structure through the manufacturing method in a second embodiment of the present invention.

As in the first embodiment, contact plugs 15 with their tops projecting out from the inter-layer film 14 as illustrated in FIG. 8(a) are formed. During this process, contact plugs 15 are formed at all positions at which contact plug formation is possible, regardless of whether or not they are to be utilized for connection with wirings 23 to be detailed later. For instance, the inter-layer film 14 may be patterned by using a common mask for a gate array image to lay out holes to constitute contact plugs 15 and form contact plugs 15 within all the holes.

Figure 8B:
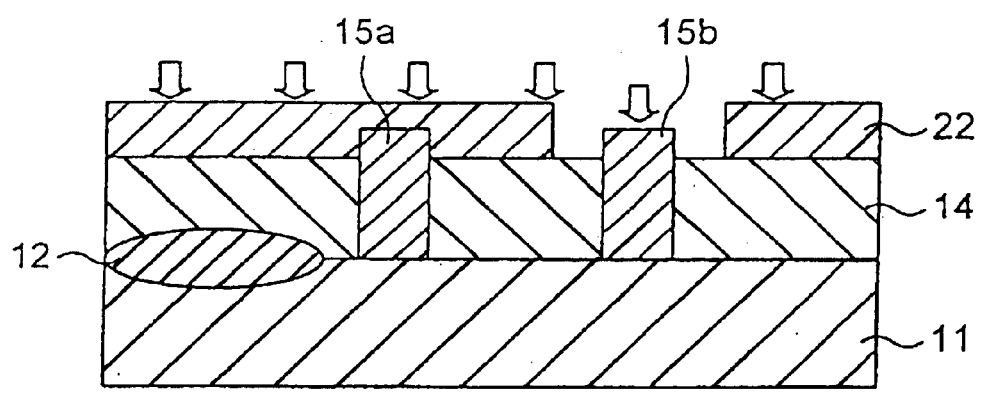

Next, after forming a film constituted of a resist 22 such as a photoresist on the inter-layer film 14, the resist 22 is patterned through lithography to remove the resist 22 over areas each corresponding to a contact plug 15b that is not to be used for connection, as illustrated in FIG. 8(b). Thus, each contact plug 15a to be used for connection becomes masked with the resist 22. By implanting phosphorus ions in this state, phosphorous is doped only over the contact plug 15b not to be utilized for connection, as illustrated in FIG. 8(b).

Figure 8C:
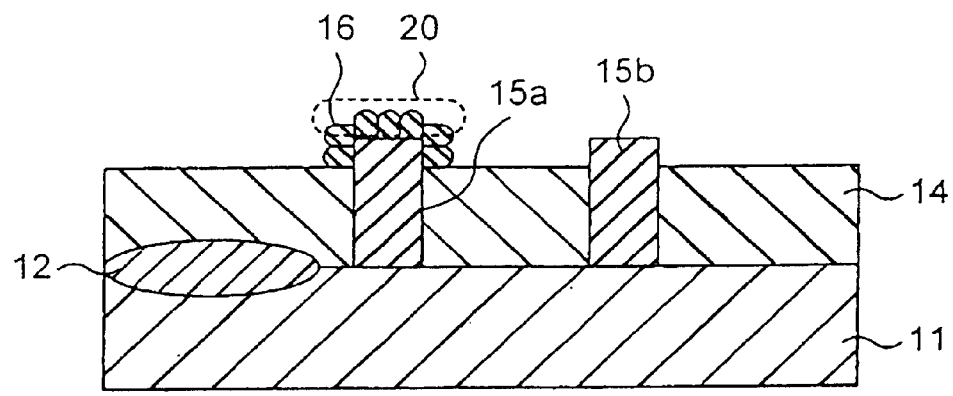

Next, after removing the resist 22 from the surface of the inter-layer film 14, an HSG forming process is implemented to form the polysilicon cap 16 constituting the receptacle area 20 over the entire surface of the top of the contact plug 15a with no polysilicon cap 16 formed at the top of the contact plug 15b, as shown in FIG. 8(c).

Figure 9A:
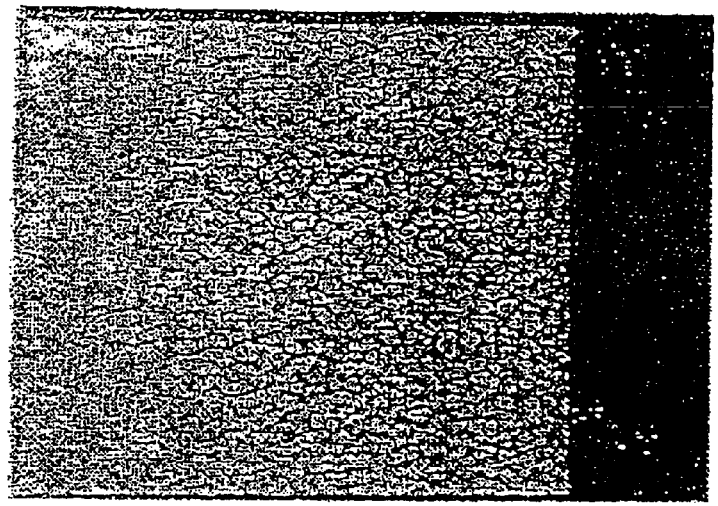
FIG. 9 illustrates how varying phosphorus concentrations affect the process implemented by adopting the HSG forming technology in the manufacturing method in the second embodiment of the present invention.
Figure 9B:
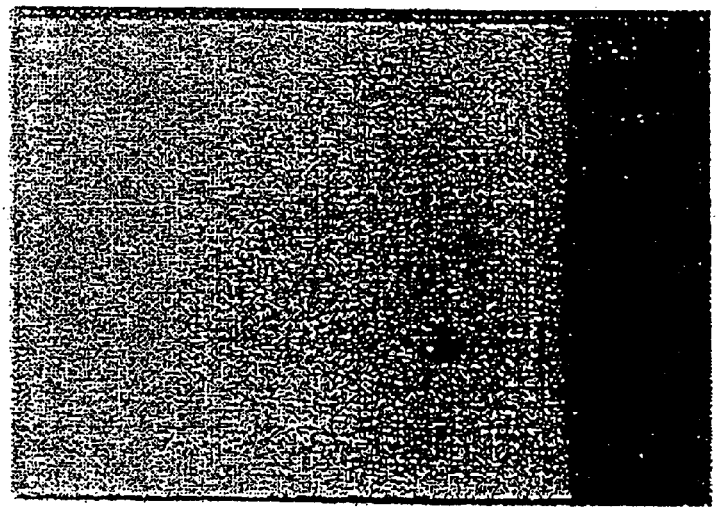

This phenomenon is attributable to the base-dependency manifesting in polysilicon formation during the HSG forming process. Namely, while hemispherical polysilicon grains are formed at the α-Si surface with a low phosphorus concentration, as illustrated in FIG. 9(a), no hemispherical polysilicon grains are formed at the α-Si surface with a high phosphorous concentration, as shown in FIG. 9(b). It is to be noted that the phenomenon of no hemispherical polysilicon grains formed at the α-Si surface with a high phosphorus concentration is normally referred to as a bald defect.

Next, a second inter-layer film 17 is formed over the inter-layer film 14 and then, holes to constitute cell contacts 19 are formed at the second inter-layer film 17 through etching. It is to be noted that the holes to constitute the cell contact 19 are formed to a depth reaching the receptacle area 20 formed at the top of the contact plug 15a. The mask common to the gate array image that has been utilized to form the contact plugs 15a and 15b, for instance, may be used in this process, to pattern the second inter-layer film 17 and lay out the holes to constitute cell contacts 19a and 19b. Then, regardless of whether or not the individual holes are to be used for connection, a cell contact 19a or 19b is formed within each hole.

Figure 8D:
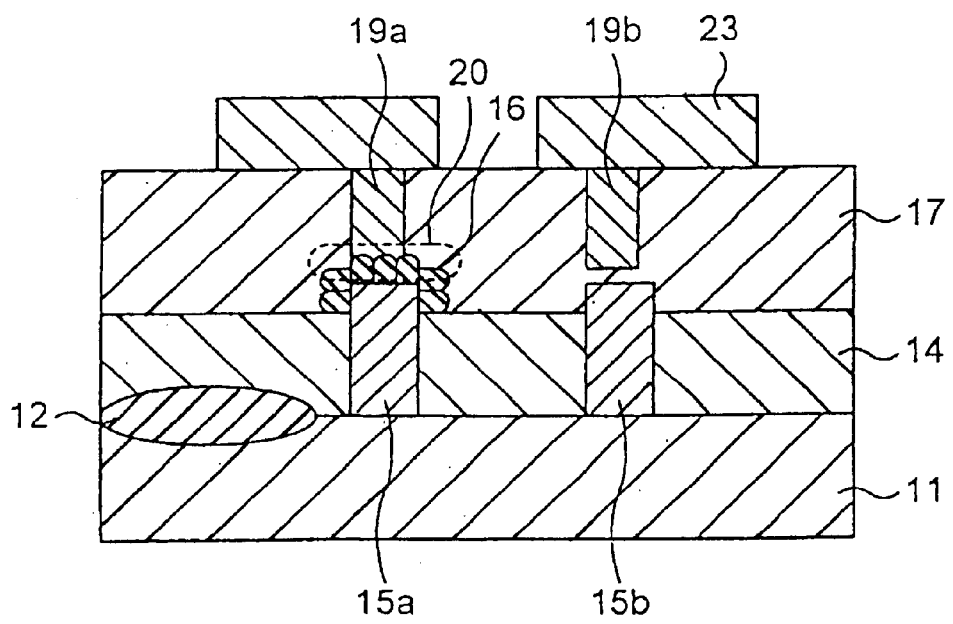

As a result, the contact plug 15a and the cell contact 19a become joined via the polysilicon cap 16 formed at the top of the contact plug 15a, as illustrated in FIG. 8(d). However, since the holes that constitute the cell contacts 19a and 19b are formed only to the depth reaching the receptacle area 20 formed at the top of the contact plug 15a, the contact plug 15b and the cell contact 19b are not joined.

In the last step, the wirings 23 are formed on the second inter-layer film 17 so as to join the cell contacts 19a and 19b.

As explained above, in the second embodiment in which the contact plug 15a and the cell contact 19a are joined with each other via the wide receptacle area 20 with a large height formed at the top of the contact plug 15a through the HSG forming process, a reliable contact is achieved with ease even when the alignment is not exact or the etching quantities are only roughly controlled.

In addition, since the contact plug 15a to be used for connection is laid out through the ion implantation, it is possible to pattern the resist 22 even if the alignment is not exact.

Furthermore, by patterning the inter-layer film 14 and the second inter-layer film 17 with a mask common to the gate array image, the cost of manufacturing the mask can be reduced.

Next, the third embodiment of the present invention is explained.

FIG. 10 presents sectional views of the steps taken to form a very small capacitor at a semiconductor element assuming a multilayer structure through the manufacturing method in the third embodiment of the present invention. It is to be noted that the same reference numbers are assigned to components having structures identical to those in the first and second embodiments to preclude the necessity for repeated explanation thereof.

In this embodiment, a semiconductor device that makes a decision with regard to the presence/absence of a signal based upon the difference between the levels of electrical charges held in capacitors, such as a ROM or a RAM, is manufactured.

Figure 10A:
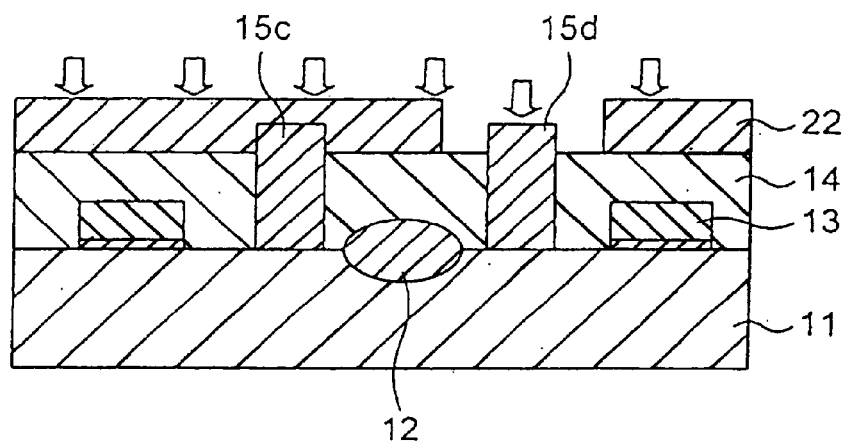
FIG. 10 presents sectional views of steps taken to form a minute capacitor at a semiconductor element assuming a multilayer structure through the manufacturing method in a third embodiment of the present invention.

First, as in the second embodiment, a contact plug 15c to be utilized as an electrode of a capacitor with a large quantity of electrical charge, which is masked with a resist 22, as shown in FIG. 10a, is obtained. By implanting phosphorous ions in this state, phosphorus becomes doped only on a contact plug 15d that is to be utilized as an electrode of a capacitor with a small quantity of electrical charge, which is not masked by the resist 22.

Figure 10B:
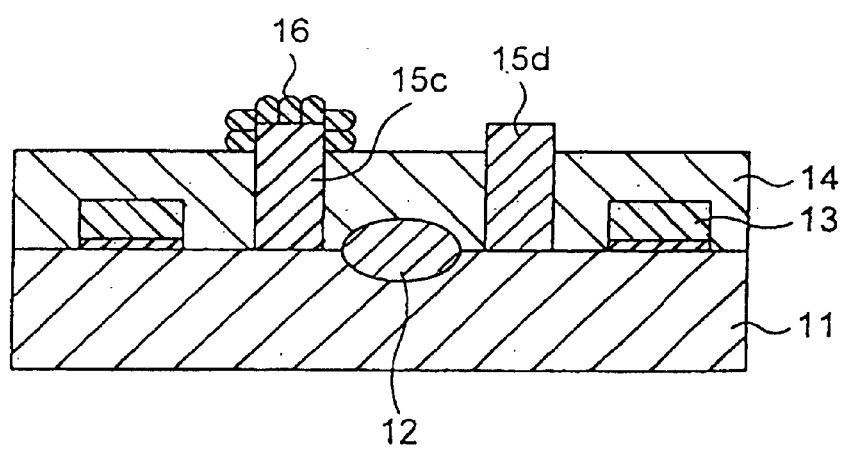

Next, as in the second embodiment, an HSG forming process is implemented after removing the resist 22 from the surface of the inter-layer film 14. As a result, as illustrated in FIG. 10(b), a polysilicon cap 16 is formed over the entire surface of the top of the contact plug 15c with no polysilicon cap 16 formed at the top of the contact plug 15d.

Figure 10C:
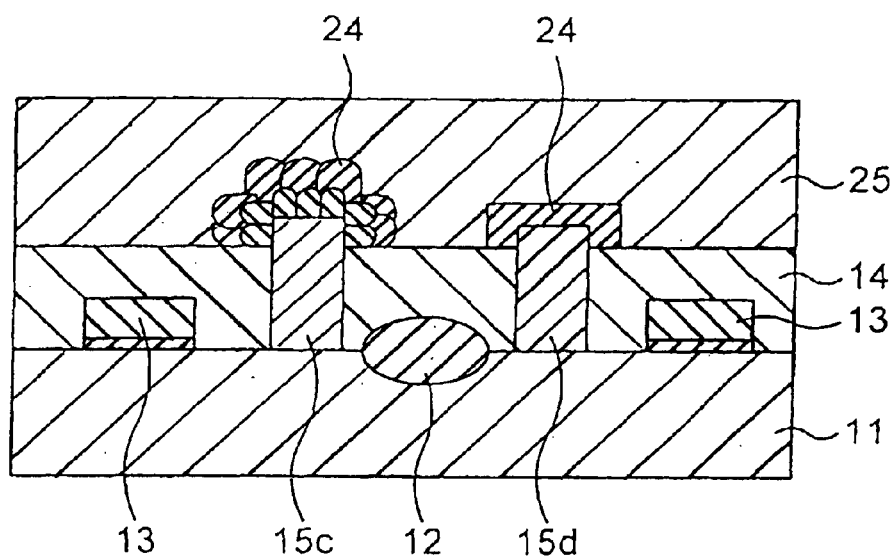

Then, as shown in FIG. 10(c), capacitor films 24 are formed by covering the areas around the tops of the contact plug 15c and 15d with a dielectric material such as silicon dioxide, and then an upper electrode 25 is formed over the entire upper surface of the inter-layer film 14.

Thus, the contact plugs 15c and 15d and the upper electrode 25 set to face opposite each other via the capacitor films 24 constituted of a dielectric material function as capacitors. In addition, since the presence of the polysilicon cap 16 formed over the entire surface at the top of the contact plug 15c increases the surface area of the top, the contact plug 15c and the upper electrode 25 function as a capacitor which holds a large quantity of electrical charge and the contact plug 15d and the upper electrode 25 function as a capacitor holding a small quantity of electrical charge. As a result, a semiconductor device having capacitors that hold varying quantities of electrical charge is obtained.

As explained above, in the third embodiment in which polysilicon cap is formed only at the top of the contact plug 15c to increase the surface area of the top through the HSG forming process implemented after implanting ions into the contact plug 15d, a semiconductor device having capacitors that hold varying quantities of electrical charge such as a ROM or a RAM can be manufactured with ease.

In addition, since a write is enabled in the ROM after forming transistors, capacitors and the like, a semiconductor device having a ROM with a short TAT (turn around time) can be obtained.

Next, the fourth embodiment of the present invention is explained.

Figure 11A:
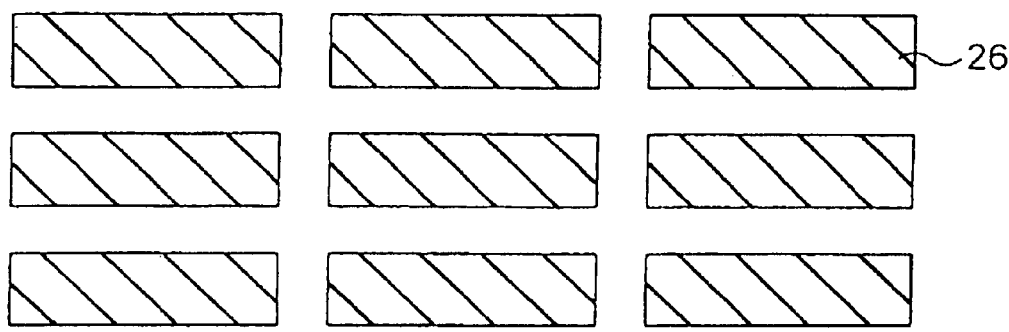
FIG. 11 presents sectional views of steps taken to form a wiring layer at a semiconductor element through the manufacturing method in a fourth embodiment of the present invention.
Figure 11B:
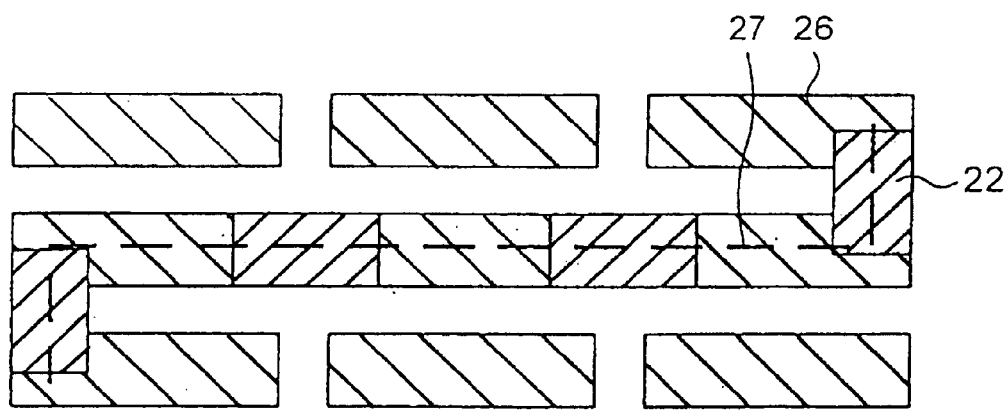
Figure 11C:
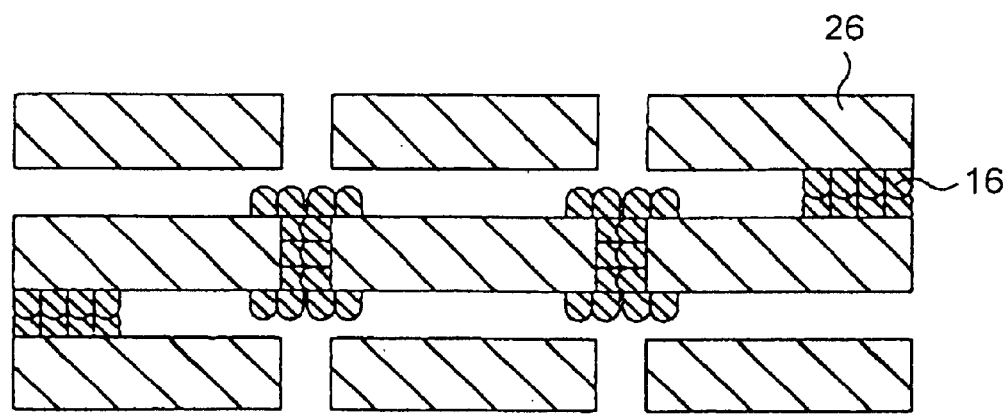

FIG. 11 presents sectional views of the steps taken to form a wiring layer at a semiconductor element through the manufacturing method in the fourth embodiment of the present invention. It is to be noted that the same reference numbers are assigned to components having structures identical to those in the first, second and third embodiments, to preclude the necessity for repeated explanation thereof.

In this embodiment, a semiconductor device having a wiring layer is formed on a silicon substrate having transistors, element isolation regions, inter-layer films, contact plugs and the like already formed thereupon.

First, a plurality of wiring blocks 26 constituted of α-Si are formed through a technology of the known art such as etching, deposition or the like, on a silicon substrate having the transistors, the element isolation regions, the inter-layer films, the contact plugs and the like already formed thereupon. The plurality of wiring blocks 26 are laid out on the silicon substrate as illustrated in FIG. 11(a). In addition, the plurality of wiring blocks 26 should be ideally set apart over a distance of 0.07 μm or less from each other.

Next, after forming a film constituted of a resist 22 on the silicon substrate having the wiring blocks 26 formed thereupon, the resist 22 is patterned through lithography to remove the resist 22 over the areas that are not to be used as a wiring pattern 27. As a result, the areas linking the wiring blocks 26 to be used for the wiring pattern 27 become masked by the resist 22, as illustrated in FIG. 11(b). By implanting phosphorous ions in this state, phosphorus becomes doped over the areas that are not to be used for the wiring pattern 27 with no phosphorous doped over the areas linking the wiring blocks 26 to be used for the wiring 27.

Then, after removing the resist 22 from the areas linking the wiring blocks 26 to be used for the wiring pattern 27, an HSG forming process is implemented. As a result, polysilicon cap 16 is formed only over the areas linking the wiring blocks 26 to be used for the wiring pattern 27, with no polysilicon cap 16 formed over other areas. Thus, specific wiring blocks are joined to form a desired writing pattern 27.

As described above, in the fourth embodiment in which the HSG forming process is implemented after ions are implanted into the areas that are not to be used for the-wiring pattern 27 so as to joined the wiring blocks 26 to be used for the wiring pattern by forming polysilicon only over the areas linking the wiring blocks 26 to be used for the wiring pattern 27, a semiconductor device achieving a desired wiring pattern 27 can be manufactured with ease.

In addition, since the layout of the wiring blocks 26 does not change among individual wiring patterns 27, a common mask can be used to form the 26, to achieve a reduction in the mask manufacturing cost.

Next, the fifth embodiment of the present invention is explained.

FIGS. 12–13 present sectional views of the steps taken to form plugs with an extremely small diameter at an inter-layer film of a semiconductor element assuming a multilayer structure through the manufacturing method in the fifth embodiment of the present invention. It is to be noted that the same reference numbers are assigned to components having structures identical to those in the first, second, third and fourth embodiments to preclude the necessity for repeated explanation thereof.

In order to manufacture a semiconductor device achieving a multilayer structure such as a DRAM, transistors, element isolation regions 12, an electrode wiring 13 which may be utilized as, for instance, a bit line, an inter-layer film 14 and the like are formed through a method of the known art on a silicon substrate 11. Then, an α-Si film to constitute a mask, i.e., a mask Si 28, is formed over the inter-layer film 14.

Figure 12A:
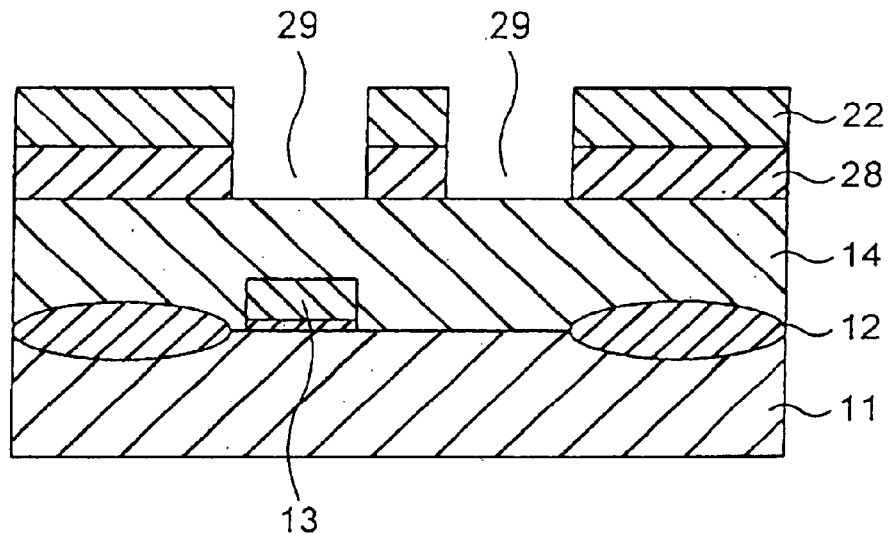
FIG. 12 presents sectional views of steps (part 1) taken to form plugs with an extremely small diameter at an inter-layer film of a semiconductor element assuming a multilayer structure through the manufacturing method in a fifth embodiment of the present invention.

Then, after forming a film constituted of a resist 22 on the mask Si 28, the resist 22 is patterned through lithography to remove the resist 22 over areas corresponding to areas 29 to be detailed later. By etching the mask Si 28 with the patterned resist 22 used as a mask, the areas 29 are formed as illustrated in FIG. 12(a).

Figure 12B:
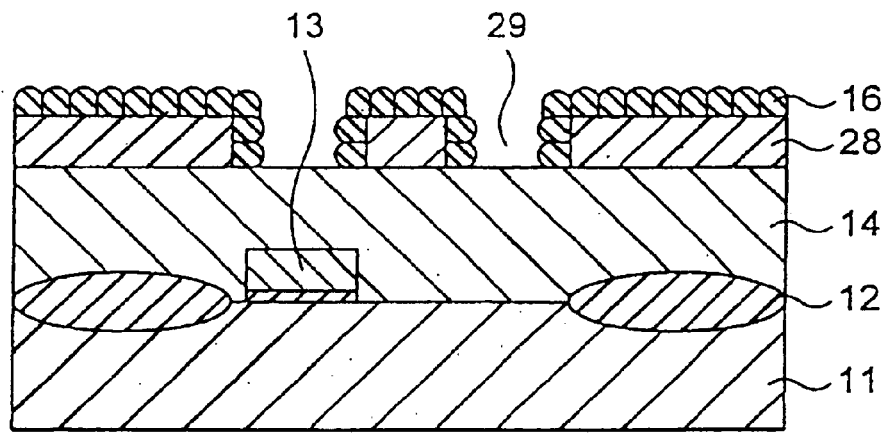

After removing the resist 22, an HSG forming process is implemented to form a polysilicon cap 16 over the entire surface of the mask Si 28 and the diameter of the areas 29 becomes reduced, as shown in FIG. 12(b).

Figure 12C:
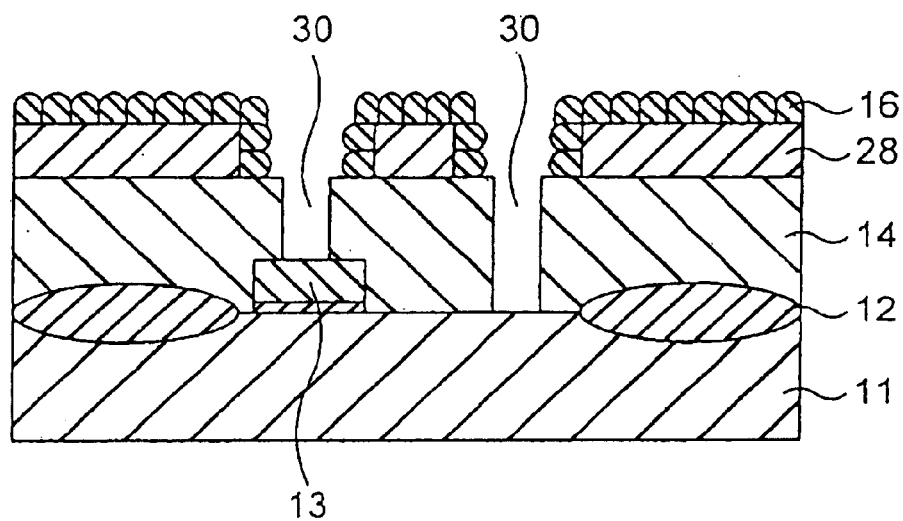

In the following step, the inter-layer film 14 is etched by using the mask Si 28 with the diameter of the areas 29 reduced as a mask to form contact holes 30, as shown in FIG. 12(c). The diameter of the contact holes 30 thus formed corresponds to the diameter of the areas 29 having been reduced by the presence of the polysilicon cap 16 and is, therefore, very small.

Figure 13A:
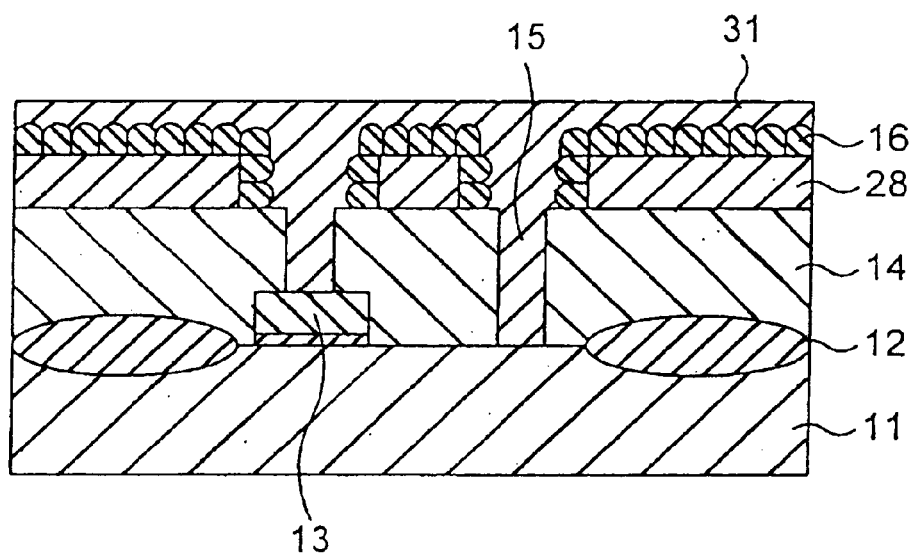
FIG. 13 presents sectional views of steps (part 2) taken to form plugs with an extremely small diameter at an inter-layer film of a semiconductor element assuming a multilayer structure through the manufacturing method in the fifth embodiment of the present invention.

Then, as illustrated in FIG. 13(a), a new polysilicon film, i.e., embedding polysilicon 31, is formed and some of the embedding polysilicon 31 enters the contact holes 30 to form contact plug 15 with an ultra-small diameter.

Figure 13B:
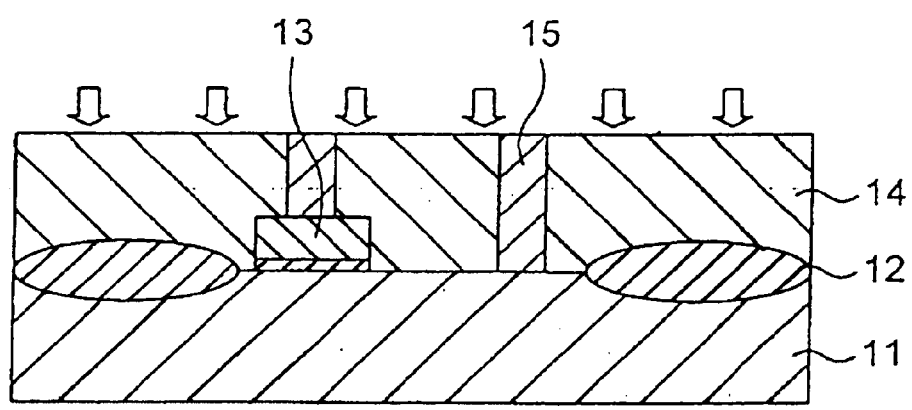

Next, the embedding polysilicon 31 and the mask Si 28 are removed through an etch-back or a CMP method, as shown in FIG. 13(b). Thus, a semiconductor device having the contact plug 15 with an ultra-small diameter in the inter-layer film 14 is achieved.

As explained above, in the fifth embodiment in which the contact holes 30 are formed by etching the inter-layer film 14 with the mask Si 28 having the diameter of the areas 29 used as a mask reduced through the HSG forming process instead of by using sidewall polysilicon for PSC (poly-sidewall contact) as a mask as in the prior art, contact holes 30 with an ultra-small diameter can be formed with ease.

In addition, the diameter of the contact holes 30 can be easily controlled by controlling the thickness of the polysilicon cap 16 formed through the HSG forming process.

Furthermore, since it is not necessary to implement steps such as the formation of sidewall polysilicon to be used for PSC and sidewall etching, the semiconductor device manufacturing cost can be reduced.

Next, the sixth embodiment of the present invention is explained.

Figure 14A:
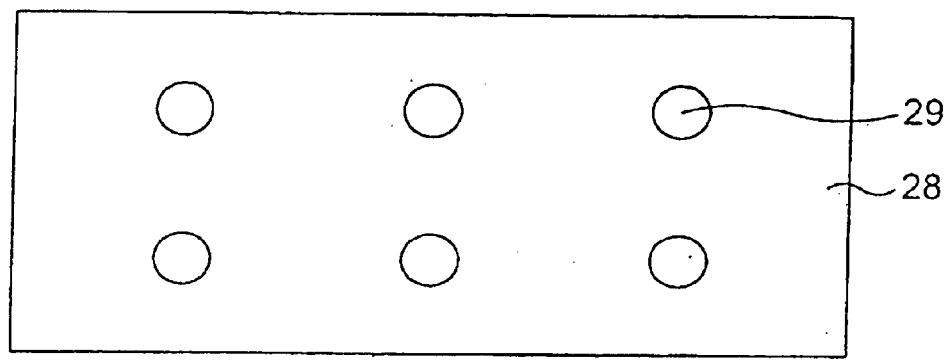
FIG. 14 presents sectional views of steps (part 1) taken to form plugs with an extremely small diameter at an inter-layer film of a semiconductor element assuming a multilayer structure through the manufacturing method in a sixth embodiment of the present invention.
Figure 14B:
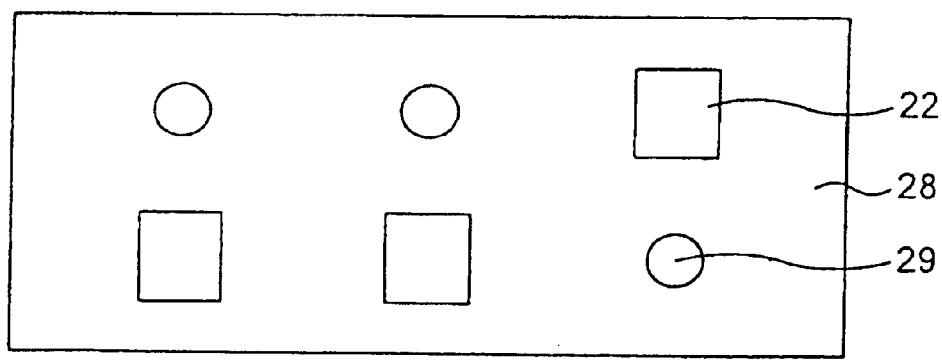
Figure 14C:
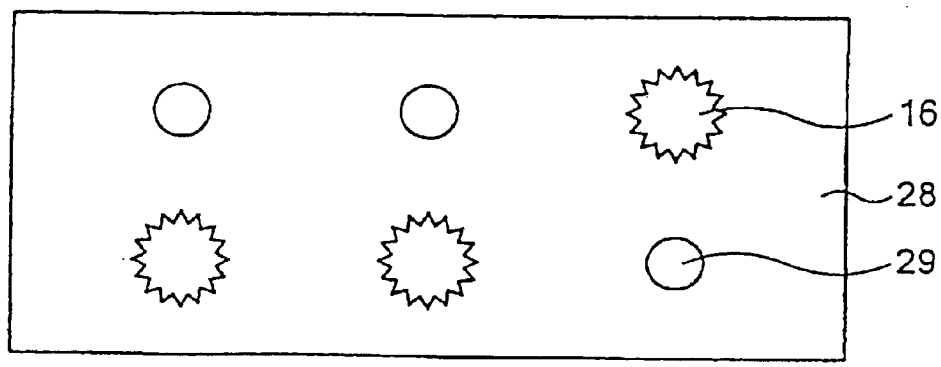
Figure 15A:
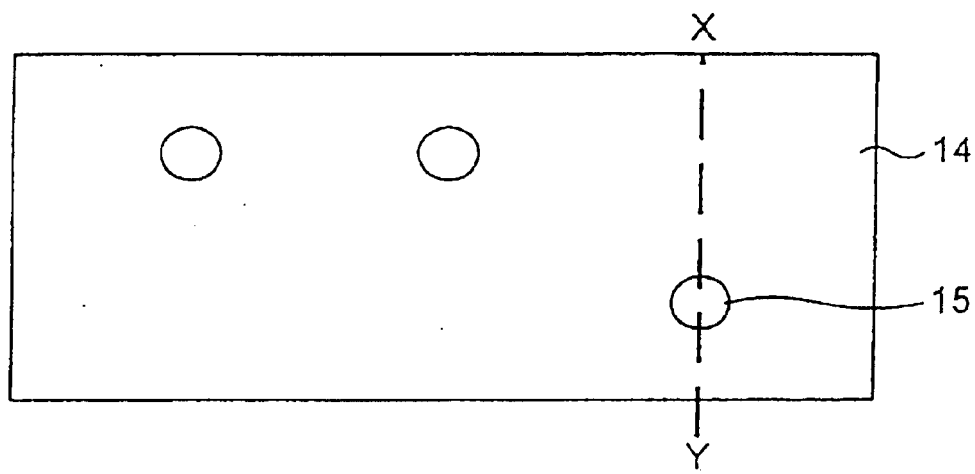
FIG. 15 presents sectional views of steps (part 2) taken to form plugs with an extremely small diameter at the inter-layer film of the semiconductor element assuming a multilayer structure through the manufacturing method in the sixth embodiment of the present invention.
Figure 15B:
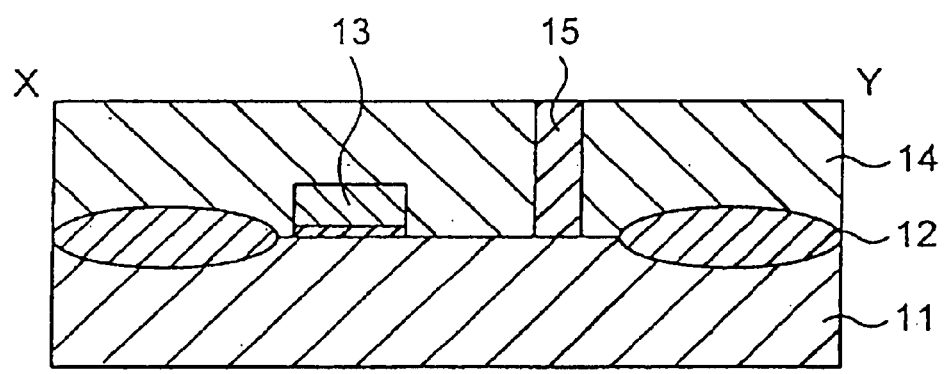

FIGS. 14 and 15 illustrate the steps taken to form plugs with an extremely small diameter at an inter-layer film of a semiconductor element assuming a multilayer structure through the manufacturing method in the sixth embodiment of the present invention. It is to be noted that FIG. 15(b) is an sectional view through line x-y in FIG. 15(a). In addition, the same reference numbers are assigned to components having structures identical to those in the first, second, third, fourth and fifth embodiments to preclude the necessity for repeated explanation thereof.

As in the fifth embodiment, areas 29 corresponding to contact holes 30 are formed at a mask Si 28 in the embodiment. During this process, the areas 29 are laid out at the mask Si 28, as illustrated in FIG. 14(a). In addition, the diameter of the areas 29 ideally should be set at approximately 0.10 μm.

Then, after forming a film constituted of a resist 22 over the mask Si 28 having the areas 29 formed therein, the resist 22 is patterned through lithography to remove the resist 22 over areas where the contact holes 30 are to be formed. Thus, the areas 29 where contact holes 30 are not to be formed become masked by the resist 22 as shown in FIG. 14(b). By implanting phosphorous ions in this state, phosphorous is doped on the areas where the contact holes 30 are to be formed, with no phosphorous doped over the areas 29 where no contact holes 30 are to be formed.

After removing the resist 22, an HSG forming process is implemented to form a polysilicon cap 16 only over the areas 29 where no contact holes 30 are to be formed thereby blocking off the areas 29, as shown in FIG. 14(c). The other areas 29, where no polysilicon is formed, on the other hand, are not blocked off.

Next, by using the mask Si 28 with some of the areas 29 blocked off as a mask, the inter-layer film 14 is etched to form contact holes 30 at positions corresponding to the unblocked areas 29.

Then, by implementing steps such as the formation of embedding polysilicon 31 and the removal of the embedding polysilicon 31 and the mask Si 28 as in the fifth embodiment, contact plugs 15 are formed at positions corresponding to the unblocked areas 29 in the inter-layer film 14 as illustrated in FIGS. 15(a) and 15(b).

As explained above, in the sixth embodiment, in which polysilicon is formed to block off the areas 29 at the positions where no contact plugs 15 are to be formed by implementing the HSG forming process after implanting ions over the areas where contact holes 30 are to be formed in the mask Si 28, i.e., the areas, where contact plugs 15 are to be formed, a semiconductor device having contact plugs 15 at desired positions can be manufactured with ease.

In addition, since the layout of the areas 29 does not change regardless of how contact plugs 15 are laid out, a common mask can be used to etch the masks Si 28 to achieve a reduction in the manufacturing cost.

Next, the seventh embodiment of the present invention is explained.

Figure 16A:
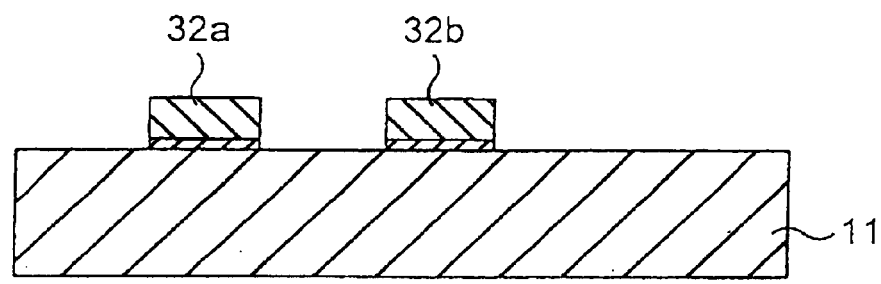
FIG. 16 presents sectional views of steps (part 1) taken to form sidewalls of gate electrodes at a transistor such as a MOSFET assuming an LDD (lightly doped drain) structure in a seventh embodiment.
Figure 16B:
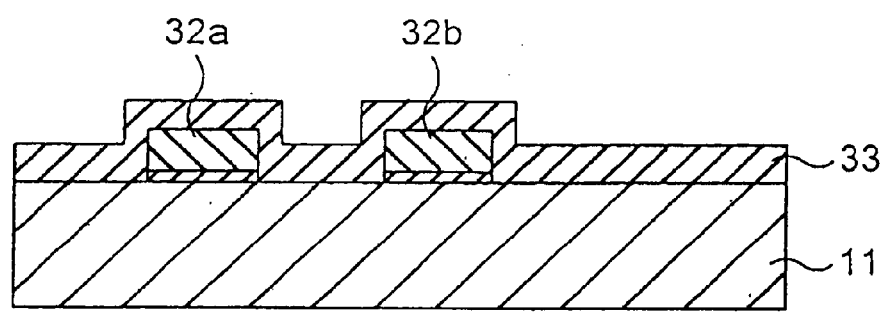
Figure 16C:
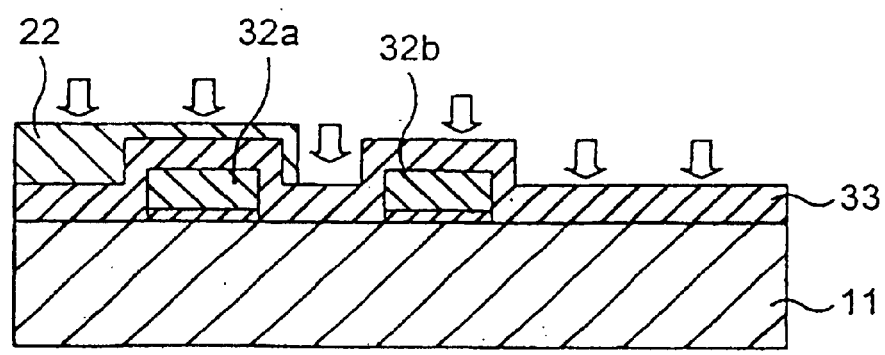
Figure 17A:
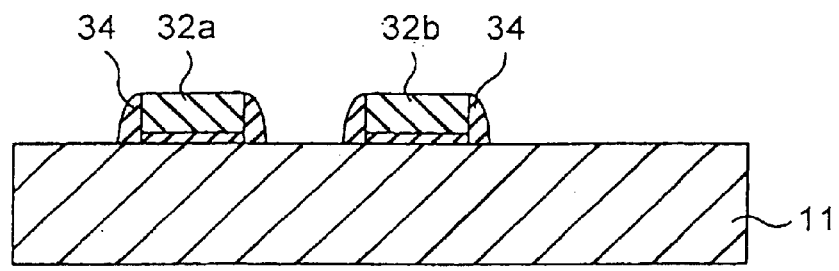
FIG. 17 presents sectional views of steps (part 2) taken form to sidewalls of a gate electrodes at a transistor such as a MOSFET assuming an LDD (lightly doped drain) structure in the seventh embodiment.
Figure 17B:
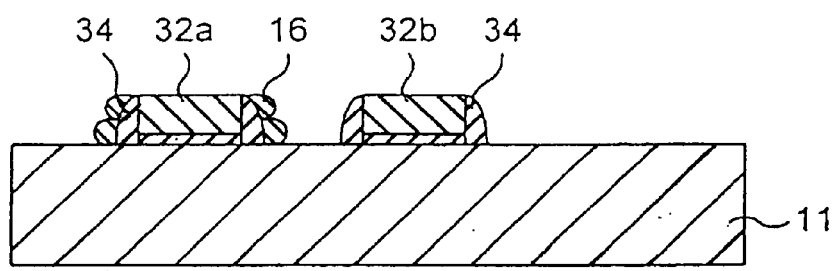
Figure 17C:
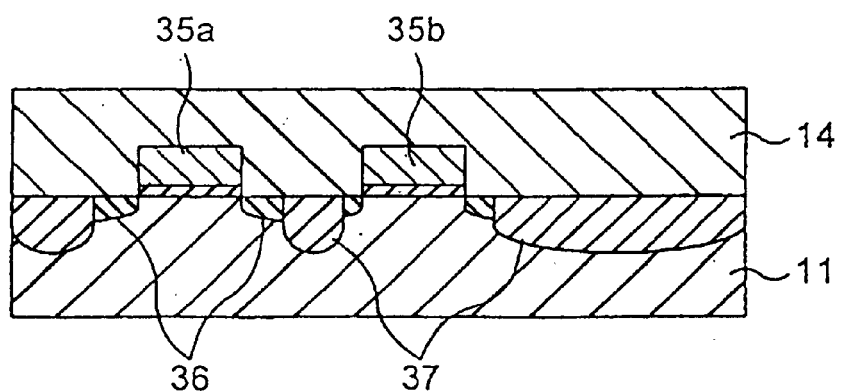

FIGS. 16 and 17 present sectional views of the steps taken to form the sidewalls of gate electrodes of a transistor such as a MOSFET having an LDD (lightly doped drain) structure through the manufacturing method in the seventh embodiment of the present invention. It is to be noted that the same reference numbers are assigned to components having structures identical to those in the first, second, third, fourth, fifth and sixth embodiments to preclude the necessity for repeated explanation thereof.

In order to manufacture a semiconductor device such as a DRAM that is provided with a transistors such as a MOSFET, first, gate electrodes 32a and 32b are formed at a silicon substrate 11 through a method of the known art, as illustrated in FIG. 16(a). It is to be noted that an insulating film is provided between the gate electrodes 32a and 32b and the silicon substrate 11 under normal circumstances.

Next, as illustrated in FIG. 16(b), an α-Si film, i.e. a sidewall Si 33, is formed over the silicon substrate 11.

After forming a film constituted of a resist 22 over the sidewall Si 33, the resist 22 is patterned through lithography to remove the resist 22 from the sidewall Si 33 around the gate electrode 32b to constitute a transistor with a small sidewall length. As a result, the sidewall Si 33 around the gate electrode 32a to constitute a transistor with a large sidewall length becomes masked by the resist 22, as illustrated in FIG. 16(c). By implanting phosphorous ions in this state, phosphorous becomes doped over the sidewall Si 33 around the gate electrode 32b, with no phosphorous doped over the sidewall Si 33 around the gate electrode 32a.

Then, by etching the sidewall Si 33 through a method of the known art, the sidewall Si 33 is allowed to remain only at the side surfaces of the gate electrodes 32a and 32b to form sidewalls 34, as illustrated in FIG. 17(a).

In the following step, an HSG forming process is implemented to form a polysilicon cap 16 only on the sidewalls 34 of the gate electrode 32a which has not been doped with phosphorous, as illustrated in FIG. 17(b). As a result, the thickness of the sidewalls 34 at the gate electrode 32a, i.e., the length along the horizontal direction in the figure, becomes larger by, for instance, approximately 0.035 μm, compared to the length of the sidewalls 34 at the gate electrode 32b. It is to be noted that the length of the sidewalls 34 of the gate electrode 32a can be adjusted by controlling the conditions under which the HSG forming process is implemented and thus varying the thickness of the polysilicon cap 16.

Next, wirings, an inter-layer film 14 and the like are formed by doping impurities over areas to constitute sources and drains through, for instance, ion implantation, to manufacture a semiconductor device having a plurality of transistors such as MOSFETs provided with source/drain areas 37 with their offset areas, i.e., LDD areas 36, ranging over varying lengths. It is to be noted that reference number 35a indicates a transistor with a large sidewall length, whereas reference number 35b indicates a transistor with a small sidewall length.

As explained above, in the embodiment in which the polysilicon cap 16 is formed only on the sidewalls 34 of the gate electrode 32a to lengthen the sidewalls 34 at the gate electrode 32a by implementing the HSG forming process after implanting ions at the sidewall Si 33 around the gate electrode 32b to constitute a transistor with a small sidewall length, a semiconductor device having a plurality of transistors with their LDD areas ranging over varying lengths can be manufactured with ease.

In addition, since the sidewall Si 33 is formed only once, the number of manufacturing steps can be minimized to reduce the manufacturing cost.

It is to be noted that the present invention is not restricted by the particulars of the embodiments described above and that numerous variations may be achieved based upon the principle of the present invention without departing from the scope of the present invention.

As explained above, the present invention achieves the following advantages.

(A) By forming polysilicon at part of a member constituting a semiconductor element or part of a mask by implementing an HSG forming process, the number of manufacturing steps such as film formation and etching can be minimized, the individual steps can be controlled with ease and a common mask can be utilized. Thus, a semiconductor device can be manufactured easily at low cost.

(B) Since polysilicon is formed at some of the members formed from α-Si and constituting a semiconductor element by implementing an HSG forming process, a semiconductor device having members in varying sizes and having various patterns, which assures reliable connections between the members is obtained.

The entire disclosure of Japanese Patent Application No. 2000-161574 filed on May 31, 2000 including specification, claims, drawings and summary is incorporated herein by reference in its entirety.

What is claimed is:

1. A semiconductor device comprising:

a plurality of substantially solid contact plugs formed in an interlayer film and each including a projection portion that extends out from the interlayer film, the contact plugs being βSi; and hemispherical polysilicon grains formed over an entirely of the projecting portions of at least some of the contact plugs.

2. A semiconductor device according to claim 1, wherein the at least some of the contact plug is selected to be utilized as capacitor electrodes.

3. A semiconductor device according to claim 1, wherein the at least some of the contact plugs having the hemispherical polysilicon grains thereon and utilized as the capacitor electrodes hold a different quantity of electrical charge than other contact plugs utilized as capacitor electrodes that do not have the hemispherical polysilicon grains thereon.

4. A semiconductor device according to claim 3, wherein the at least some of the contact plugs having the hemispherical polysilicon grains thereon and utilized as the capacitor electrodes hold a different quantity of electrical charge than other contact plugs utilized as capacitor electrodes that do not have the hemispherical poylsilicon grains thereon.

5. A semiconductor device as recited in claim 1, wherein the α-Si includes phosophorus in an amount of $1 \times 10^{20}$ cm$^{-3}$ or less.

* * * * *